United States Patent
Sato et al.

(10) Patent No.: US 8,580,053 B2
(45) Date of Patent: Nov. 12, 2013

(54) TA SPUTTERING TARGET AND METHOD FOR PRODUCING THE SAME

(75) Inventors: Motonori Sato, Kanagawa-ken (JP);
Poong Kim, Kanagawa-ken (JP);
Manabu Ito, Kanagawa-ken (JP);
Tadashi Masuda, Kanagawa-ken (JP)

(73) Assignee: Ulvac, Inc., Kanagawa (JP)

( * ) Notice: Subject to any disclaimer, the term of this patent is extended or adjusted under 35 U.S.C. 154(b) by 193 days.

(21) Appl. No.: 13/182,259

(22) Filed: Jul. 13, 2011

(65) Prior Publication Data

US 2011/0265921 A1 Nov. 3, 2011

Related U.S. Application Data

(62) Division of application No. 11/785,065, filed on Apr. 13, 2007, now abandoned.

(30) Foreign Application Priority Data

Apr. 13, 2006 (JP) ................................. 2006-110513
Apr. 6, 2007 (JP) ................................. 2007-100772

(51) Int. Cl.
*C22F 1/18* (2006.01)

(52) U.S. Cl.
USPC .................................... 148/668; 204/298.13

(58) Field of Classification Search
USPC ........................................................ 148/668
See application file for complete search history.

(56) References Cited

U.S. PATENT DOCUMENTS

| | | | |
|---|---|---|---|
| 6,193,821 B1 * | 2/2001 | Zhang | 148/668 |
| 6,348,113 B1 | 2/2002 | Michaluk et al. | |
| 8,061,177 B2 * | 11/2011 | Jepson | 72/356 |
| 8,172,960 B2 * | 5/2012 | Oda et al. | 148/422 |
| 2005/0268999 A1 | 12/2005 | Oda | |

FOREIGN PATENT DOCUMENTS

| | | |
|---|---|---|
| JP | 11-080942 A | 3/1999 |
| JP | 2002-530534 A | 9/2002 |
| JP | 2004-107758 A | 4/2004 |
| JP | 2004-526863 A | 9/2004 |
| WO | WO 00/31310 A1 | 6/2000 |
| WO | WO 02/070765 A1 | 9/2002 |

* cited by examiner

*Primary Examiner* — George Wyszomierski
(74) *Attorney, Agent, or Firm* — Arent Fox LLP

(57) ABSTRACT

A method for producing a Ta sputtering target including the following steps: (a) a step of forging a Ta ingot, comprising subjecting the Ta ingot to a forging pattern over at least 3 times, wherein each forging pattern is "a cold forging step comprising stamp-forging and upset-forging operations alternatively repeated over at least 3 times; (b) an in-process vacuum heat-treating step carried out between every successive two forging patterns to thus prepare a Ta billet; (c) a step of rolling the Ta billet to obtain a rolled plate; and (d) a step of vacuum heat-treating the rolled plate to obtain a Ta sputtering target. A sputtering target produced by the above method.

8 Claims, 1 Drawing Sheet

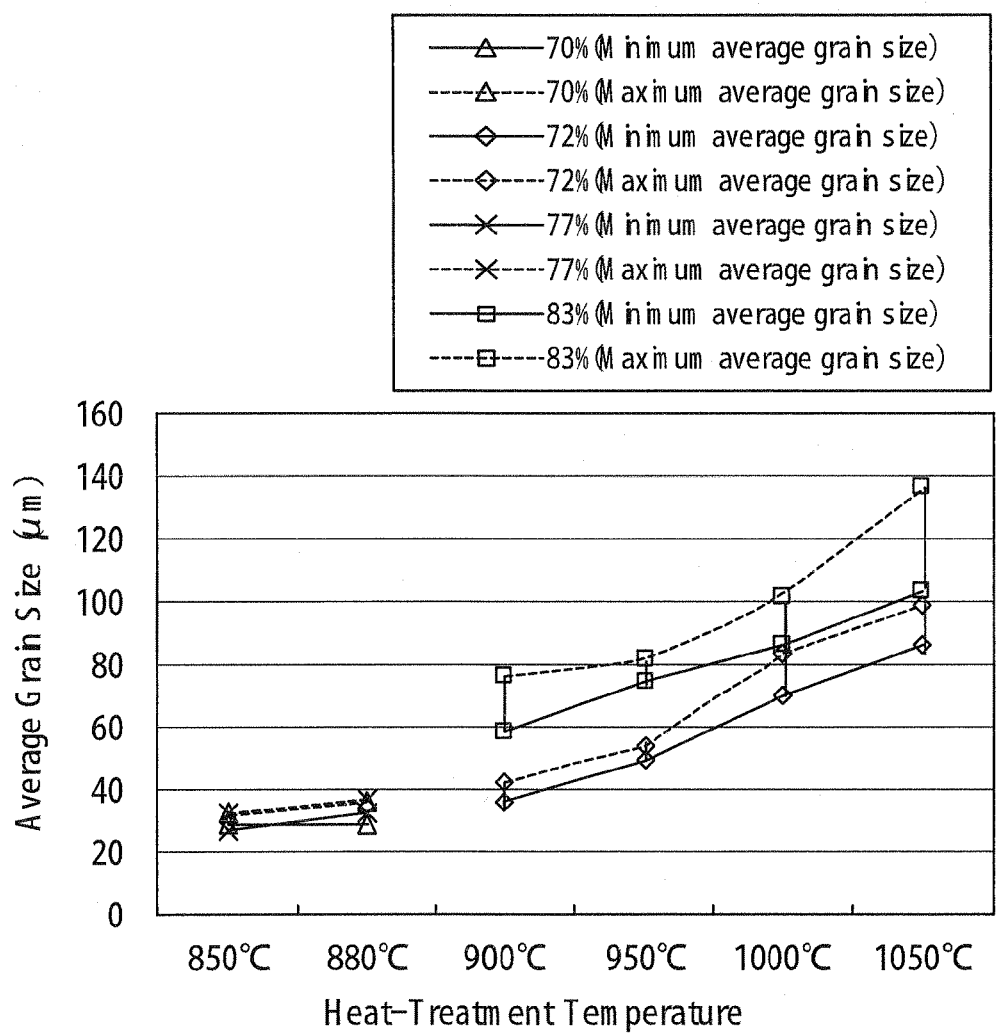

TA SPUTTERING TARGET AND METHOD FOR PRODUCING THE SAME

CROSS-REFERENCE TO RELATED APPLICATIONS

This is a divisional application which claims the benefit of U.S. patent application Ser. No. 11/785,065, filed Apr. 13, 2007, now abandoned, and claims priority of Japanese Patent Application No. 2006-110513, filed Apr. 13, 2006, and Japanese Patent Application No. 2007-100772, filed Apr. 6, 2007. The disclosures of the prior applications are hereby incorporated herein in their entirety by reference.

TECHNICAL FIELD

The present invention relates to a sputtering target which is subjected to a sputtering processing which is a thin film forming technique, and to a method for the production thereof and, more particularly, to a Ta sputtering target having a uniform crystalline microstructure and a method for the production of the same.

BACKGROUND ART

Up to now, in the field of semiconductors, a barrier metal film layer has been formed. Such a barrier metal film layer has conventionally been formed, in the form of a thin film between a wiring films and insulating films. Such a barrier metal film layer has conventionally been formed in the form of a thin film according to, for instance, the sputtering technique. It has therefore been required for the barrier metal film layer to be formed with a thinner and more uniform thickness. For this reason, it has correspondingly been required for the sputtering target used for forming a barrier metal film layer to make the grain size of the constituent metal finer and more uniform for the purpose of ensuring the uniformity of the resulting film within the plane thereof (so-called plane uniformity) and for the control of the formation of any particulate material during the sputtering operations. In case a film for making Cu wiring is used, it is known to use Ta for forming a barrier metal film layer. Regarding the Ta sputtering target used for forming a Ta barrier metal film layer, it would likewise be effective to make the average grain size of Ta finer and to control the local scattering of the grain size, in order to control the formation of any particulate material during the sputtering operations and to likewise control the occurrence of any scattering in the sheet resistance of the resulting thin film.

To this end, there have variously been investigated the development of methods for preparing a Ta sputtering target, which can make the grain size of the Ta sputtering target finer and can make the average grain size smaller, thereby inhibiting the occurrence of any scattering in the grain size thereof. In order to make the crystalline microstructure of a metal material uniform and finer, it is general practice to perform the following, namely, the sputtering target be produced by setting the processed amount (reduction ratio) at a level as high as possible upon the plastic forming operations. Subsequently, heat-treating conditions are selected to prevent the grain size from getting too large or coarse. As the method for producing the Ta sputtering target, there have been following reports when largely classified.

(1) A method in which the processed amount is increased through the use of the combination of stamping and upsetting forging operations to thereby prepare a forged slab (billet). Thereafter, the slab (billet) is subjected to a vacuum heat treatment and to a cold rolling operation. The rolled plate is subjected to vacuum heat treatment.

(2) A method in which a slab or billet is prepared by a combination of two or more knead-forging operations and vacuum heat treatments. The slab or billet is then subjected to cross-rolling, and then the rolled plate is subjected to vacuum heat treatment (see, for instance, JP-A-1999-80942, JP-A-2004-107758, Int'l Appln. Published under PCT (Tokuhyo) No. JP-A-2004-526863 (WO02/070765 A1), and Int'l Appln. Published under PCT (Tokuhyo) No. 2002-530534 (WO00/31310)).

Ta sputtering targets were produced by way of experiments according to these methods, but these methods are not always sufficient for the preparation of a Ta sputtering target having sufficiently fine crystalline microstructure with small scattering of the average grain size. The inventors of this invention have cleared up the causes of the foregoing drawbacks associated with the above-described methods. They have found that the foregoing drawbacks are caused for the following reasons, namely:

(1) the forging conditions thereof were inadequate and thus the crystalline microstructure of the billet (slab) was not uniform;

(2) the draft percentage at the time of rolling was inadequate (i.e., the draft percentage was small); and (3) the heat-treating conditions of the plate to be rolled were inadequate.

The reason why the crystalline microstructure of the billet was not uniform can be attributed to the following, namely:

(1) the shape of the ingot (i.e., too large or too small an aspect ratio);

(2) apparatus used for the production (i.e., too small a load of the pressing machine); and (3) method of forging (i.e., too small the number of axes or too small the number of repeated operations).

For instance, when the length L of the ingot or when the length L at the time of deformation during forging is below 0.5 to 0.6 times the diameter φ thereof, the force during the stamp-forging never easily reaches the central portion of the ingot. Therefore, the resulting forged product is liable to have a concave area at the center thereof or in the vicinity of the center (hereunder referred to as "central portion") with respect to the side thereof near the outer periphery or outer regions (hereunder referred to as "outer peripheral portion"). As a result, the resulting product has a crystalline microstructure insufficient in the uniformity between the outer peripheral portion and the central portion. If this non-uniformity is more conspicuous, the concave area in the central portion would remain depending on the thickness of the billet even if the subsequent upset-forging operation is carried out and this would become a cause of a considerable reduction in the production yield of such billets. In addition, when the length L of an ingot or the length L observed upon the deformation through the forging is more than 1.5 to 2.0 times the diameter φ thereof in the stamp-forging operation, the ingot may easily undergo buckling and deflection during the upset-forging operation. In other words, in case the aspect ratio (diameter/length) is inadequate with the ingot or at the time of deformation by forging, a stable production by cold forging cannot be made. As a result, there arises a problem in that the uniformity in the crystalline microstructure cannot be attained, i.e., in that the yield is lowered.

The usual sputtering target can be obtained by the rolling of a billet after the forging of a starting ingot and the subsequent heat-treating processes. Even if a billet which is high in uniformity in the crystalline structure is prepared, the subsequent lower draft percentage at the time of rolling will result in a failure to obtain, in the subsequent heat treating, a uniform and crystalline microstructure. On the other hand, even if a billet which is high in uniformity in crystalline microstructure is prepared, too high a draft percentage will give rise to a problem in that the growth into too coarse a grain size of the crystalline microstructure is likely to be accelerated in the subsequent heat treating.

DISCLOSURE OF THE INVENTION

The problem of the present invention is to solve the foregoing problems associated with the aforementioned conventional techniques. In other words, it is an object of the present invention to provide a Ta sputtering target having a fine and uniform crystalline microstructure by improving the uniformity in the crystalline microstructure without lowering the yield, and by optimizing the conditions for combining the draft percentage at the time of the subsequent rolling and the vacuum heat treating. The present invention also provides a method for producing the Ta target.

According to the present invention, there is thus provided a method for producing a Ta sputtering target, which comprises:

(a) a step of forging a Ta ingot, comprising subjecting the Ta ingot to a forging pattern over at least 3 times or not less than 3 times, wherein each forging pattern is "a cold forging step comprising stamp-forging and upset-forging operations alternatively repeated over at least 3 times or not less than 3 times";

(b) an in-process vacuum heat-treating step carried out between every successive two forging patterns to thus prepare a Ta billet;

(c) a step of subjecting the Ta billet to rolling, preferably cold rolling, at an appropriate draft percentage to thereby obtain a rolled plate; and (d) a step of vacuum heat-treating the rolled plate to obtain a Ta sputtering target having a uniform and crystalline microstructure.

According to a preferred embodiment of the foregoing invention, the Ta ingot used in the method is of a shape having an aspect ratio (length/diameter) ranging from 0.7 to 1.5. The use of a Ta ingot having such an aspect ratio (length/diameter) falling within the range specified above would keep nonuniform deformation from taking place during forging operation, thereby allowing the impartment of uniform strain to the whole ingot. It is thus possible to improve the uniformity in the crystalline microstructure of the Ta billet without lowering the yield of the Ta billets. If the aspect ratio is less than 0.7, there is observed a difference in the degree of deformation of the ingot between the peripheral portion or area and the central portion or area thereof upon the stamp-forging operation and accordingly, the central area in the proximity to the central axis of the ingot is liable to become depressed. This in turn leads to the production of a Ta billet insufficient in the uniformity of the crystalline microstructure thereof. On the other hand, if the aspect ratio exceeds 1.5, the ingot is quite susceptible for the occurrence of buckling and deflection upon the upset-forging operation and accordingly, the method never permits any stable production of desired billets.

According to another embodiment of the foregoing invention, the change in shape of the ingot during the foregoing stamp-forging and upset-forging operations is performed within an aspect ratio (length/diameter) ranging from 0.7 to 1.5. If the range of ingot deformation is kept within such an aspect ratio, the nonuniform deformation during forging can be restricted, thereby imparting distortion or strain to the whole ingot. As a result, the uniformity in the crystalline microstructure of the Ta billet can be improved without lowering the yield of the Ta billet. On the other hand, if the ingot is deformed within a range of aspect ratio of less than 0.7, the billet is likely to be insufficient in uniformity in the crystalline microstructure. If the aspect ratio exceeds 1.5, the ingot is quite susceptible for the occurrence of buckling and deflection and accordingly, the method never permits any stable production of desired billets.

According to a still another preferred embodiment of the foregoing production method, the step of rolling of the Ta billet is performed in a cold rolling operation in at least 4 axial directions at a total draft percentage ranging from 65 to 75%, and the step of vacuum heat-treating the rolled plate is performed at a temperature ranging from 850 to 950° C. If this rolling operation is performed only in 2 or 3 axial directions, it would be quite difficult to obtain a product having a circular cross section. If the total draft percentage is less than 65%, it is impossible to attain a uniform and crystalline microstructure in the subsequent heat treatment of the rolled plate. If the total draft percentage exceeds 75%, the grain size of the rolled plate is likely to grow coarser in the vacuum heat treatment. Moreover, if the temperature of the heat treatment is less than 850° C., the resulting product does not have a recrystallized microstructure, while if it exceeds 950° C., there is locally observed areas in which crystal grains become coarser, with the result that uniformity in crystalline microstructure cannot be obtained.

According to a still further embodiment of the foregoing invention, the ingot used is one having a total content of impurities including Al, Cr, Fe, Ni, Ti, Na, Mg, K, Si, Cu, Co, Nb, W, Mo, U and Th on the order of not more than 50 ppm and contents of C, N and O of not more than 50 ppm, respectively. Even when using a Ta ingot having such high purity, the foregoing method of the present invention permits the production of a Ta sputtering target whose grain sizes are quite fine and which is free of any scattering of the grain size.

According to another aspect of the present invention, there is provided a Ta sputtering target which can be produced according to the aforementioned production method, which has an average grain size ranging from 30 to 50 μm and whose grain size never varies widely. The Ta sputtering target thus produced is characterized in that it has a total content of impurities including Al, Cr, Fe, Ni, Ti, Na, Mg, K, Si, Cu, Co, Nb, W, Mo, U and Th on the order of not more than 50 ppm and contents of C, N and O of not more than 50 ppm, respectively. The Ta sputtering target is one with a small dispersion in grain size.

EFFECTS OF THE INVENTION

According to the present invention, the uniformity in the crystalline microstructure of the billet can be improved without lowering the yield in the forging. In addition, by optimizing the conditions for combining the total draft percentage and the vacuum heat treatment during the forging of the billet, Ta sputtering target having a fine and uniform microstructure, as well as the method for producing the same can be provided.

BRIEF DESCRIPTION OF THE DRAWING

FIG. 1 is a graph showing the relation between the heat-treatment temperature and the average grain size of each of the rolled plates which were obtained by rolling the billet obtained after repeating the forging pattern three times, while variously changing the total draft percentage thereof.

BEST MODE FOR CARRYING OUT THE INVENTION

In accordance with the method for the production of the Ta sputtering target according to the present invention, a Ta billet is prepared by a method comprising a step of forging a Ta ingot in which a Ta ingot is subjected to a forging pattern, made up of a desired cold forging step, over at least 3 times or not less than 3 times; and an in-process vacuum heat-treating step carried out between every successive two forging patterns. This forging pattern is made up of "a cold forging step comprising stamp-forging and upset-forging operations alternatively repeated over at least 3 times or not less than 3 times. In this respect, the order of these stamp-forging and upset-forging operations may arbitrarily be selected.

According to the present invention, an ingot whose shape is specified by the aspect ratio (length/diameter) ranging from 0.7 to 1.5 is used as a starting Ta ingot. The deformation of the ingot during the stamp-forging and upset-forging operations is carried out in such a manner that the aspect ratio (length/diameter) falls within the range from 0.7 to 1.5. The forging pattern, whose one cycle comprises repeating stamp-forging and upset-forging operations over at least 3 times in all and preferably 3 to 5 times in all, is repeated over at least 3 times or not less than 3 times while maintaining or controlling the shape and the degree of deformation of the starting material in such a manner that the length/diameter ratio ranges from 0.7 to 1.5. Further, a vacuum heat-treating step is carried out between every successive two forging patterns. This vacuum heat treatment would be able not only to prevent the occurrence of any cracking of the Ta ingot during the forging operation, but also to improve the unification of crystalline microstructure of the resulting Ta billet as well as the production yield of the same. In this case, the vacuum heat-treating step is preferably carried out at a pressure of not more than $1.3 \times 10^{-2}$ Pa and a temperature of about 1050° C.±50° C. Thus, a Ta sputtering target having an average grain size ranging from 30 to 50 μm, with a small scattering of the grain size, having a uniform crystalline microstructure can be produced by performing vacuum heat treatment of thus obtained Ta billet, at a desired draft percentage, and under specific vacuum heat-treating conditions (a pressure of not more than $1.3 \times 10^{-2}$ Pa and a temperature ranging from 850 to 950° C.).

According to the present invention, there can be solved the problems associated with the conventional techniques concerning the forging, rolling and/or heat-treating steps for obtaining a uniform crystalline microstructure of a metallic material. More specifically, as described hereinabove, consideration is made of the shape of the ingot of weight and material, required for obtaining the shape of the final product. In performing the forging operation, the ingot (starting material) is set to the predetermined aspect ratio (length/diameter) ranging from 0.7 to 1.5. This ingot is subjected to the stamp-forging and upset-forging operations which are alternatively repeated over a plurality of times at an aspect ratio (length/diameter) ranging from 0.7 to 1.5.

If the number of repeated times of these stamp-forging and upset-forging operations is too large at this stage, however, the ingot may easily cause cracking during forging. If the repeated number is small, on the other hand, any desired forging effect cannot be expected. Therefore, the number of these operations alternatively repeated is not less than 3 times in all and preferably about 3 to 5 times in all as has been already discussed above. This forging process, comprising the stamp-forging and upset-forging operations alternatively repeated over the predetermined times, is herein defined to be one cycle of a forging pattern, and the forging pattern is preferably repeated over at least 3 times or not less than 3 times. In this connection, the vacuum heat-treating step discussed above is carried out between every successive two forging patterns in order to prevent any cracking of the billet through the forging operation due to work hardening, as well as in order to unifying the crystalline structure of the billet. This vacuum heat-treating step would be able to prevent the occurrence of any cracking through the forging operation. Accordingly, the unification of the crystalline microstructure of the billet can be improved without reducing the number of the forging steps. By repeating this forging pattern over at least 3 times or not less than 3 times rather than 2 times, while carrying out the vacuum heat-treating step between every successive two forging patterns, the unification of the crystalline microstructure can be improved.

In general, the Ta sputtering target can be obtained by the reduction of the thickness of the billet (slab) through, for instance, rolling operations. However, if the rate of the cold processing is too high, the range of optimum vacuum heat-treating conditions for obtaining a uniform and crystalline microstructure becomes narrow. Therefore, in order to obtain a uniform crystalline microstructure, the heat-treating temperature shall preferably be set to a level ranging from 850 to 950° C., while keeping the draft percentage at the time of cold rolling to about 65 to 75%. According to the above-described forging, rolling, and heat-treating methods, the average grain size as the crystalline microstructure has 30 to 50 μm. It is thus possible to obtain a uniform crystalline microstructure with small dispersion in grain size. In addition, if the rolling operation is carried out in not less than 4 axial directions, preferably 4 to 8 axial directions, rather than in 1 or 2 axial directions, there can be eliminated any morphology having the grain-oriented pattern which is observed after having placed in service the obtained Ta sputtering target.

The sputtering target having a uniform and crystalline microstructure according to the present invention can be obtained by appropriately combining the steps of forging, vacuum heat treatment to be carried out between every successive two forging patterns, rolling operation, and vacuum heat treatment of a rolled plate as discussed hereinabove.

EXAMPLE

The present invention will hereunder be described in more detail with reference to the following non-limitative Examples, but the present invention is not restricted to these specific Examples at all.

Example 1

First, a Ta ingot having a size of 140 mmφ×200 mmL was subjected to stamp-forging and upset-forging operations alternatively repeated 3 times to thus obtain a primary forged billet, and then the latter was subjected to vacuum heat treatment (not more than $1.3 \times 10^{-2}$ Pa; 1050° C.). The resulting primary forged billet was then subjected to the same procedures used in the primary forging step to thus prepare a secondary forged billet. Then the secondary forged billet was subjected to the same vacuum heat treatment used above and thereafter, it was further subjected to a third forging step according to the same procedures used above. The surface of the resulting tertiary forged billet was processed (working with a lathe) to thus remove any defect such as surface defects, cracks and/or fogging or protective covering, then subjected to a cold rolling operation in 4 axial directions at a total draft percentage of 70%. The resulting rolled plate was subjected to a vacuum heat treatment at 850° C. (not more than $1.3\times10^{-2}$ Pa). It was found that the average grain size on the whole surface of the resulting (thus obtained) sputtering target (3 portions, i.e., the central, middle and peripheral portions) fell within the range from 29 to 32 μm and that the standard deviation of the grain size thereof was found to be 13 μm. Incidentally, in this Example, the foregoing surface processing was carried out according to the treatment with a lathe, but the surface processing may likewise be carried out according to the machining such as the mechanical treatment using a milling machine.

Example 2

The surface-processed tertiary forged billet prepared according to the method described in Example 1 was subjected to a cold rolling operation in 6 axial directions at a total draft percentage of 70%. The resulting rolled plate was subjected to a vacuum heat treatment at 880° C. As a result, it was found that the average grain size on the whole surface of the resulting sputtering target fell within the range from 29 to 36 μm and that the standard deviation of the grain size thereof was found to be 17 μm.

Example 3

The surface-processed tertiary forged billet prepared according to the method described in Example 1 was subjected to a cold rolling operation in 8 axial directions at a total draft percentage of 72% and the resulting rolled plate was subjected to a vacuum heat treatment at 900° C. As a result, it was found that the average grain size on the whole surface of the resulting sputtering target fell within the range from 36 to 42 μm and that the standard deviation of the grain size thereof was found to be 19 μm.

Example 4

The surface-processed tertiary forged billet prepared according to the method described in Example 1 was subjected to a cold rolling operation in 6 axial directions at a total draft percentage of 72% and the resulting rolled plate was subjected to a vacuum heat treatment at 950° C. As a result, it was found that the average grain size on the whole surface of the resulting sputtering target fell within the range from 49 to 54 μm and that the standard deviation of the grain size thereof was found to be 30 μm.

Example 5

The surface-processed tertiary forged billet prepared according to the method described in Example 1 was subjected to a cold rolling operation in 8 axial directions at a total draft percentage of 77% and the resulting rolled plate was subjected to a vacuum heat treatment at 850° C. As a result, it was found that the average grain size on the whole surface of the resulting sputtering target fell within the range from 27 to 32 μm and that the standard deviation of the grain size thereof was found to be 13 μm.

Example 6

The surface-processed tertiary forged billet prepared according to the method described in Example 1 was subjected to a cold rolling operation in 8 axial directions at a total draft percentage of 77% and the resulting rolled plate was subjected to a vacuum heat treatment at 880° C. As a result, it was found that the average grain size on the whole surface of the resulting sputtering target fell within the range from 32 to 37 μm and that the standard deviation of the grain size thereof was found to be 17 μm.

Example 7

The surface-processed tertiary forged billet prepared according to the method described in Example 1 was subjected to a vacuum heat treatment (not more than $1.3\times10^{-2}$ Pa; 1050° C.) and then the same procedures used above were repeated to thus obtain a quaternary forged billet. The quaternary forged billet thus obtained was subjected to the same surface-treatment used in Example 1 and then to a cold rolling operation in 4 axial directions at a total draft percentage of 70%. The resulting rolled plate was subjected to a vacuum heat treatment at 850° C. As a result, it was found that the average grain size on the whole surface of the resulting sputtering target fell within the range from 29 to 31 μm and that the standard deviation of the grain size thereof was found to be 12 μm.

Example 8

The surface-processed quaternary forged billet prepared according to the method described in Example 7 was subjected to a cold rolling operation in 6 axial directions at a total draft percentage of 77%. The resulting rolled plate was subjected to a vacuum heat treatment at 850° C. As a result, it was found that the average grain size on the whole surface of the resulting sputtering target fell within the range from 27 to 31 μm and that the standard deviation of the grain size thereof was found to be 12 μm.

Comparative Example 1

A Ta ingot having a size of 140 mmφ×200 mmL was forged (flattening forging) into a slab and was then subjected to the surface-processing (in this case, the mechanical treatment using a milling machine) as carried out in Example 1. Then the resulting product was subjected to a cold rolling operation in a single axial direction at a total draft percentage of 57%. It was then subjected to a vacuum heat treatment at 1150° C. As a result, it was found that the average grain size on the whole surface of the resulting sputtering target fell within the range from 222 to 380 μm although the average grain size widely varied depending on positions on the resulting sputtering target, that fine grain areas and coarse grain areas were randomly distributed throughout the whole surface thereof, and that the standard deviation of the grain size thereof was found to be 348 μm.

Comparative Example 2

A Ta ingot having a size of 140 mmφ×200 mmL was forged (flattening forging) into a slab and then subjected to the surface-processing (in this case, the mechanical treatment using a milling machine) as carried out in Example 1. Then the resulting product was subjected to a cold rolling operation in two axial directions at a total draft percentage of 57% and it was then subjected to a vacuum heat treatment at 1050° C. As a result, it was found that the average grain size of the resulting sputtering target fell within the range from 75 to 333 μm, that fine grain areas and coarse grain areas were randomly distributed throughout the whole surface thereof like the target produced in Comparative Example 1, and that the standard deviation of the grain size thereof was found to be 220 μm.

Comparative Example 3

A Ta ingot having a size of 140 mmφ×200 mmL was subjected to stamp-forging and upset-forging operations alternatively repeated 3 times to thus obtain a primary forged billet. Then the resulting primary forged billet was subjected to a vacuum heat treatment (1050° C.). The resulting primary forged billet was then subjected to the same procedures used in the foregoing primary forging step to thus prepare a secondary forged billet. Then the secondary forged billet was subjected to the same surface-processing used in Example 1 and further to a cold rolling operation in 4 axial directions at a total draft percentage of 57% to thus obtain a rolled plate. The resulting rolled plate was subjected to a vacuum heat treatment at 1050° C. As a result, it was found that the average grain size on the whole surface of the resulting sputtering target fell within the range from 104 to 150 μm, and that the standard deviation of the grain size thereof was found to be 90 μm.

Comparative Example 4

A secondary forged billet was prepared by repeating the same procedures used in Comparative Example 3. This billet was subjected to the same surface-processing used in Example 1 and further to a cold rolling operation in 6 axial directions at a total draft percentage of 72% to thus obtain a rolled plate. The resulting rolled plate was subjected to a vacuum heat treatment at 1050° C. As a result, it was found that the average grain size on the whole surface of the resulting sputtering target fell within the range from 80 to 100 μm, and that the standard deviation of the grain size thereof was found to be 59 μm.

Comparative Example 5

A tertiary forged billet prepared according to the same method used in Example 1 was subjected to the same surface-processing used in Example 1 and further to a cold rolling operation in 6 axial directions at a total draft percentage of 72% to thus obtain a rolled plate. The resulting rolled plate was subjected to a vacuum heat treatment at 1050° C. As a result, it was found that the average grain size on the whole surface of the resulting sputtering target fell within the range from 86 to 99 μm, and that the standard deviation of the grain size thereof was found to be 54 μm.

Comparative Example 6

A tertiary forged billet prepared according to the same method used in Example 1 was subjected to the same surface-processing used in Example 1 and further to a cold rolling operation in 6 axial directions at a total draft percentage of 72% to thus obtain a rolled plate. The resulting rolled plate was subjected to a vacuum heat treatment at 1000° C. As a result, it was found that the average grain size on the whole surface of the resulting sputtering target fell within the range from 70 to 84 μm and, that the standard deviation of the grain size thereof was found to be 39 μm.

Comparative Example 7

A tertiary forged billet prepared according to the same method used in Example 1 was subjected to the same surface-processing used in Example 1 and further to a cold rolling operation in 8 axial directions at a total draft percentage of 83% to thus obtain a rolled plate. The resulting rolled plate was subjected to a vacuum heat treatment at 900° C. As a result, it was found that the average grain size on the whole surface of the resulting sputtering target fell within the range from 58 to 76 μm, and that the standard deviation of the grain size thereof was found to be 44 μm.

Comparative Example 8

A tertiary forged billet prepared according to the same method used in Example 1 was subjected to the same surface-processing used in Example 1 and further to a cold rolling operation in 6 axial directions at a total draft percentage of 83% to thus obtain a rolled plate. The resulting rolled plate was subjected to a vacuum heat treatment at 950° C. As a result, it was found that the average grain size on the whole surface of the resulting sputtering target fell within the range from 75 to 82 μm, and that the standard deviation of the grain size thereof was found to be 45 μm.

Comparative Example 9

A tertiary forged billet prepared according to the same method used in Example 1 was subjected to the same surface-processing used in Example 1 and further to a cold rolling operation in 8 axial directions at a total draft percentage of 83% to thus obtain a rolled plate. The resulting rolled plate was subjected to a vacuum heat treatment at 1000° C. As a result, it was found that the average grain size on the whole surface of the resulting sputtering target fell within the range from 86 to 102 μm, and that the standard deviation of the grain size thereof was found to be 49 μm.

Comparative Example 10

A tertiary forged billet prepared according to the same method used in Example 1 was subjected to the same surface-processing used in Example 1 and further to a cold rolling operation in 8 axial directions at a total draft percentage of 83% to thus obtain a rolled plate. The resulting rolled plate was subjected to a vacuum heat treatment at 1050° C. As a result, it was found that the average grain size on the whole surface of the resulting sputtering target fell within the range from 103 to 137 μm, and that the standard deviation of the grain size thereof was found to be 76 μm.

The conditions for the preparation of the sputtering targets used in the foregoing Examples 1 to 8 and Comparative Examples 1 to 10, as well as the average grain sizes (3 portions, i.e., the central, middle and peripheral portions) of the grains present on the whole surface of each of the resulting sputtering targets and the standard deviation of the grain size thereof are summarized in the following Tables 1 to 5. Further, the relation between the heat treatment temperature and the average grain size of the rolled plates is shown in the graph of FIG. 1. The billets in question were obtained by repeating the number of forging (i.e., the number of repeating the forging pattern) for three times. The billets thus obtained were then subjected to rolling of different draft percentages, thereby obtaining rolled plates. In Tables 1 to 5, the term "4N5" appearing in the column entitled "Purity" means that each of the Ta sputtering targets produced in these Examples and Comparative Examples has an overall content of impurities including Al, Cr, Fe, Ni, Ti, Na, Mg, K, Si, Cu, Co, Nb, W, Mo, U and Th on the order of not more than 50 ppm and each content of C, N or O of not more than 50 ppm. Moreover, the term "Forging Number" likewise appearing in these Tables means the repeated number of the forging patterns prior to the rolling (in this respect, one forging pattern comprises stamp-forging and upset-forging operations alternatively repeated over three times). In addition, the term "standard deviation of the grain size (S.D. of C.G. Size)" means the maximum value determined by taking photographs of three portions on the surface of each target (the central, middle and peripheral portions) and then analyzing the sizes of the grains present in each visual field using the known image-processing device. This value does not correspond to the standard deviation for the average grain sizes on the three portions of each target, but it may be considered to be effective as a criterion used for the evaluation of the uniformity of the grain size.

Moreover, there are summarized the effect of forging technique on making grain size uniform in Table 2; the effect of the draft percentage on making grain size uniform and fine in Table 3; the effect of the forging number on making grain size uniform in Table 4; and the effect of drat percentage on the scattering of the grain size in Table 5.

TABLE 1

|  | Ex. No. | | | |
| --- | --- | --- | --- | --- |
|  | 1 | 2 | 3 | 4 |
| Purity | 4N5 | 4N5 | 4N5 | 4N5 |
| Forging Tech. | Stamp-forging operation + Upset-forging operation | | | |
| Forging No. | 3 times | 3 times | 3 times | 3 times |
| Rolling Dir. | 4 axial dirs. | 6 axial dirs. | 8 axial dirs. | 6 axial dirs. |
| Rate of Red. (%) | 70 | 70 | 72 | 72 |
| Temp. (° C.) And Pr. (Pa)* | 1050; ≤1.3 × $10^{-2}$ | 1050; ≤1.3 × $10^{-2}$ | 1050; ≤1.3 × $10^{-2}$ | 1050; ≤1.3 × $10^{-2}$ |
| Temp. (° C.) And Pr. (Pa)** | 850; ≤1.3 × $10^{-2}$ | 880; ≤1.3 × $10^{-2}$ | 900; ≤1.3 × $10^{-2}$ | 950; ≤1.3 × $10^{-2}$ |
| Av. Grain Size (Max.-Min.) | 32-29 μm | 36-29 μm | 42-36 μm | 54-49 μm |
| S.D. of C.G. Size | 13 μm | 17 μm | 19 μm | 30 μm |

|  | Ex. No. | | | |
| --- | --- | --- | --- | --- |
|  | 5 | 6 | 7 | 8 |
| Purity | 4N5 | 4N5 | 4N5 | 4N5 |
| Forging Tech. | Stamp-forging operation + Upset-forging operation | | | |
| Forging No. | 31 times | 3 times | 4 times | 4 times |
| Rolling Dir. | 8 axial dirs. | 8 axial dirs. | 4 axial dirs. | 6 axial dirs. |
| Rate of Red. (%) | 77 | 77 | 70 | 77 |
| Temp. (° C.) And Pr. (Pa)* | 1050; ≤1.3 × $10^{-2}$ | 1050; ≤1.3 × $10^{-2}$ | 1050; ≤1.3 × $10^{-2}$ | 1050; ≤1.3 × $10^{-2}$ |
| Temp. (° C.) And Pr. (Pa)** | 850; ≤1.3 × $10^{-2}$ | 880; ≤1.3 × $10^{-2}$ | 850; ≤1.3 × $10^{-2}$ | 850; ≤1.3 × $10^{-2}$ |
| Av. Grain Size (Max.-Min.) | 32-27 μm | 37-32 μm | 31-29 μm | 31-27 μm |
| S.D. of C.G. Size | 13 μm | 17 μm | 12 μm | 12 μm |

*The temperature and pressure used in the vacuum heat treatment carried out between every two successive forging patterns;
**The temperature and pressure used in the vacuum heat treatment of rolled plate.

TABLE 2

Effect of Forging Technique on Making Grain Size Uniform

|  | Comp. Ex. No. | | |
| --- | --- | --- | --- |
|  | 1 | 2 | 3 |
| Purity | 4N5 | 4N5 | 4N5 |
| Forging Tech. | Flattening Forging | Flattening Forging | Stamp-forging + Upset-forging |
| Forging No. | Once | Once | Twice |
| Rolling Dir. | 1 axial dir. | 2 axial dirs. | 4 axial dirs. |
| Rate of Red. (%) | 57 | 57 | 57 |
| Temp. (° C.) And Pr. (Pa)* | — | — | 1050; ≤1.3 × $10^{-2}$ |
| Temp. (° C.) And Pr. (Pa)** | 1150; ≤1.3 × $10^{-2}$ | 1050; ≤1.3 × $10^{-2}$ | 1050; ≤1.3 × $10^{-2}$ |
| Av. Grain Size (Max.-Min.) | 380-222 μm | 333-75 μm | 150-104 μm |
| S.D. of C.G. Size | 348 μm | 220 μm | 90 μm |

*The temperature and pressure used in the vacuum heat treatment carried out between every two successive forging patterns;
**The temperature and pressure used in the vacuum heat treatment of rolled plate.

TABLE 3

Effect of Draft Percentage on Making Grain Size Uniform and Fine

| | Comp. Ex. No. | | | |
|---|---|---|---|---|
| | 3 | 4 | 5 | 10 |
| Purity | 4N5 | 4N5 | 4N5 | 4N5 |
| Forging Tech. | Stamp-forging operation + Upset-forging operation | | | |
| Forging No. | 2 times | 2 times | 3 times | 3 times |
| Rolling Dir. | 4 axial dirs. | 6 axial dirs. | 6 axial dirs. | 8 axial dirs. |
| Rate of Red. (%) | 57 | 72 | 72 | 83 |
| Temp. (° C.) And Pr. (Pa)* | 1050; ≤1.3 × $10^{-2}$ | 1050; ≤1.3 × $10^{-2}$ | 1050; ≤1.3 × $10^{-2}$ | 1050; ≤1.3 × $10^{-2}$ |
| Temp. (° C.) And Pr. (Pa)** | 1050; ≤1.3 × $10^{-2}$ | 1050; ≤1.3 × $10^{-2}$ | 1050; ≤1.3 × $10^{-2}$ | 1050; ≤1.3 × $10^{-2}$ |
| Av. Grain Size (Max.-Min.) | 150-104 μm | 100-80 μm | 99-86 μm | 137-103 μm |
| S.D. of C.G. Size | 90 μm | 59 μm | 54 μm | 76 μm |

*The temperature and pressure used in the vacuum heat treatment carried out between every two successive forging patterns;
**The temperature and pressure used in the vacuum heat treatment of rolled plate.

TABLE 4

Effect of Forging Number for Making Grain Size Uniform

| | Comp. Ex. No. | |
|---|---|---|
| | 4 | 5 |
| Purity | 4N5 | 4N5 |
| Forging Tech. | Stamp-forging operation + Upset-forging operation | |
| Forging No. | 2 times | 3 times |
| Rolling Dir. | 6 axial dirs. | 6 axial dirs. |
| Rate of Red. (%) | 72 | 72 |
| Temp. (° C.) And Pr. (Pa)* | 1050; ≤1.3 × $10^{-2}$ | 1050; ≤1.3 × $10^{-2}$ |
| Temp. (° C.) And Pr. (Pa)** | 1050; ≤1.3 × $10^{-2}$ | 1050; ≤1.3 × $10^{-2}$ |
| Av. Grain Size (Max.-Min.) | 100-80 μm | 99-86 μm |
| S.D. of C.G. Size | 59 μm | 54 μm |

*The temperature and pressure used in the vacuum heat treatment carried out between every two successive forging patterns;
**The temperature and pressure used in the vacuum heat treatment of rolled plate.

TABLE 5

Effect of Draft Percentage on Scattering of Grain Size

| | Ex. 4 | Comp. Ex. 3 | Comp. Ex. 6 |
|---|---|---|---|
| Purity | 4N5 | 4N5 | 4N5 |
| Forging Tech. | Stamp-forging operation + Upset-forging operation | | |
| Forging No. | 3 times | 2 times | 3 times |
| Rolling Dir. | 6 axial dirs. | 4 axial dirs. | 6 axial dirs. |
| Rate of Red. (%) | 72 | 57 | 72 |
| Temp. (° C.) And Pr. (Pa)* | 1050; ≤1.3 × $10^{-2}$ | 1050; ≤1.3 × $10^{-2}$ | 1050; ≤1.3 × $10^{-2}$ |
| Temp. (° C.) And Pr. (Pa)** | 950; ≤1.3 × $10^{-2}$ | 1050; ≤1.3 × $10^{-2}$ | 1000; ≤1.3 × $10^{-2}$ |
| Av. Grain Size (Max.-Min.) | 54-49 μm | 150-104 μm | 84-70 μm |
| S.D. of C.G. Size | 30 μm | 90 μm | 39 μm |

| | Comp. Ex. No. | | |
|---|---|---|---|
| | 7 | 8 | 9 |
| Purity | 4N5 | 4N5 | 4N5 |
| Forging Tech. | Stamp-forging operation + Upset-forging operation | | |
| Forging No. | 3 times | 3 times | 3 times |
| Rolling Dir. | 8 axial dirs. | 6 axial dirs. | 8 axial dirs. |
| Rate of Red. (%) | 83 | 83 | 83 |
| Temp. (° C.) And Pr. (Pa)* | 1050; ≤1.3 × $10^{-2}$ | 1050; ≤1.3 × $10^{-2}$ | 1050; ≤1.3 × $10^{-2}$ |
| Temp. (° C.) And Pr. (Pa)** | 900; ≤1.3 × $10^{-2}$ | 950; ≤1.3 × $10^{-2}$ | 1000; ≤1.3 × $10^{-2}$ |
| Av. Grain Size (Max.-Min.) | 76-58 μm | 82-75 μm | 102-86 μm |
| S.D. of C.G. Size | 44 μm | 45 μm | 49 μm |

*The temperature and pressure used in the vacuum heat treatment carried out between every two successive forging patterns;
**The temperature and pressure used in the vacuum heat treatment of rolled plate.

As will be clear from the results obtained in the foregoing Examples and Comparative Examples as well as the data listed in the foregoing Tables 1 to 5, a Ta ingot can be forged to obtain a Ta billet wherein the forging step comprises subjecting the Ta ingot to a forging pattern, as a single cycle, over at least 3 times or not less than 3 times. In addition, vacuum heat treatment is respectively performed between every successive two forging patters, thereby preparing the Ta billets. As a result, the crystalline microstructure of the Ta billets can be unified without lowering the yield. Furthermore, it can be seen that, by optimization the conditions of combining the draft percentage and the vacuum heat treatment, Ta sputtering targets can be provided which are provided with fine and uniform crystalline microstructure.

According to the present invention, an ingot whose aspect ratio (length/diameter) ranging from 0.7 to 1.5 is used. In addition, the range of deformation of the ingot when it is subjected to the stamp-forging and upset-forging operations is limited to the aspect ratio of 0.7 to 1.5. As a result, non-uniform deformation at the time of forging operations can be restricted so that the strain (distortion) can be added to the whole, thereby no possibility of lowering the yield of Ta billets.

In addition, it is also clear that a Ta sputtering target having a uniform crystalline microstructure can be provided by subjecting the Ta billet to a cold rolling operation in at least 4 axial directions at a total draft percentage ranging from 65 to 75%, and then by subjecting the rolled plate to a vacuum heat treatment at a temperature ranging from 850 to 950° C.

Moreover, the intended purpose of the present invention can likewise be accomplished even when using a Ta ingot of high purity.

According to the present invention, the crystalline microstructure of the Ta billet can be unified without lowering the yield at forging operation. Further, by optimizing the conditions for combining the rolling of the Ta billet and the vacuum heat treatment, it is possible to provide a Ta sputtering target and the method of manufacturing the same. Consequently, the present invention is applicable to the technical fields which require the formation, e.g., of a thin film uniform and thin, such as the field of semiconductor.

What is claimed is:

1. A method for producing a Ta sputtering target comprising:
　(a) a step of forging a Ta ingot having a length and a diameter, comprising subjecting the Ta ingot to a forging pattern over at least 3 times, wherein each forging pattern is a cold forging step comprising stamp-forging and upset-forging operations alternatively repeated over at least 3 times;
　(b) an in-process vacuum heat-treating step carried out between every successive two forging patterns to thus prepare a Ta billet;
　(c) a step of rolling the Ta billet to obtain a rolled plate; and
　(d) a step of vacuum heat-treating the rolled plate to obtain a Ta sputtering target.

2. The method for producing a Ta sputtering target as set forth in claim 1, wherein the Ta ingot used is one having an aspect ratio (length/diameter) ranging from 0.7 to 1.5.

3. The method for producing a Ta sputtering target as set forth in claim 1, wherein during the foregoing stamp-forging and upset-forging operations, the ingot maintains an aspect ratio (length/diameter) ranging from 0.7 to 1.5.

4. The method for producing a Ta sputtering target as set forth in claim 2, wherein during the foregoing stamp-forging and upset-forging operations, the ingot maintains an aspect ratio (length/diameter) ranging from 0.7 to 1.5.

5. The method for producing a Ta sputtering target as set forth in any one of claims 1 to 4, wherein the step of rolling of the Ta billet is performed in a cold rolling operation in at least 4 axial directions at a total draft percentage ranging from 65 to 75%, and wherein the step of vacuum heat-treating the rolled plate is performed at a temperature ranging from 850 to 950° C.

6. The method for producing a Ta sputtering target as set forth in any one of claims 1 to 4,
　wherein the Ta ingot used is one having a total content of impurities on the order of not more than 50 ppm, the impurities being selected from the group consisting of Al, Cr, Fe, Ni, Ti, Na, Mg, K, Si, Cu, Co, Nb, W, Mo, U, Th, and combinations thereof, and
　wherein a content of each C, N and O in the Ta ingot is not more than 50 ppm.

7. The method for producing a Ta sputtering target as set forth in any one of claims 1 to 4, wherein the Ta sputtering target produced has a crystalline microstructure of an average grain size ranging from 30 to 50 μm.

8. The method for producing a Ta sputtering target as set forth in claim 7, wherein the average grain size of the crystalline microstructure has a standard deviation of about 12 μm to about 30 μm.

* * * * *